(12) United States Patent
In et al.

(10) Patent No.: US 11,929,028 B2
(45) Date of Patent: Mar. 12, 2024

(54) DISPLAY PANEL AND DISPLAY DEVICE INCLUDING SAME

(71) Applicant: Samsung Display Co., Ltd., Yongin-Si (KR)

(72) Inventors: Hai-Jung In, Yongin-si (KR); Minku Lee, Yongin-si (KR); Seunghee Lee, Yongin-si (KR)

(73) Assignee: Samsung Display Co., Ltd., Yongin-Si (KR)

( * ) Notice: Subject to any disclaimer, the term of this patent is extended or adjusted under 35 U.S.C. 154(b) by 0 days.

(21) Appl. No.: 18/096,601

(22) Filed: Jan. 13, 2023

(65) Prior Publication Data

US 2023/0317003 A1    Oct. 5, 2023

(30) Foreign Application Priority Data

Apr. 5, 2022    (KR) .................. 10-2022-0042434

(51) Int. Cl.
*G09G 3/3233* (2016.01)
*G09G 3/3291* (2016.01)
*H10K 59/131* (2023.01)

(52) U.S. Cl.
CPC ......... *G09G 3/3233* (2013.01); *H10K 59/131* (2023.02); *G09G 2300/0426* (2013.01); *G09G 2300/0819* (2013.01); *G09G 2300/0842* (2013.01); *G09G 2300/0861* (2013.01); *G09G 2330/04* (2013.01)

(58) Field of Classification Search
CPC ......... G09G 3/3233; G09G 2300/0426; G09G 2300/0819; G09G 2300/0842; G09G 2300/0861; G09G 2330/04; H10K 59/131
See application file for complete search history.

(56) References Cited

U.S. PATENT DOCUMENTS

| 6,274,908 | B1 | 8/2001 | Yamaguchi et al. |
| 7,804,669 | B2 | 9/2010 | Worley |
| 8,675,323 | B2 | 3/2014 | Sudo |
| 9,413,167 | B2 | 8/2016 | Ebisuno |
| 10,714,931 | B2 | 7/2020 | Yuan et al. |
| 11,217,134 | B2 | 1/2022 | Fujikawa |

(Continued)

FOREIGN PATENT DOCUMENTS

| JP | 6296277 B2 | 3/2018 |
| KR | 10-1999-0036477 A | 5/1999 |

(Continued)

*Primary Examiner* — Md Saiful A Siddiqui
(74) *Attorney, Agent, or Firm* — Innovation Counsel LLP

(57) ABSTRACT

A display panel includes an electrostatic protection circuit including a first protection circuit electrically connected between a first signal line and a second signal line. The first protection circuit includes a first transistor connected between the first signal line and the second signal line and including a gate electrode and a lower gate electrode, a first resistor connected between the gate electrode of the first transistor and the second signal line, a first capacitor connected between the gate electrode of the first transistor and the second signal line, and a second capacitor connected between the lower gate electrode of the first transistor and the second signal line. The lower gate electrode of the first transistor receives a reference voltage.

20 Claims, 11 Drawing Sheets

(56) References Cited

U.S. PATENT DOCUMENTS

| | | | |
|---|---|---|---|
| 2004/0070901 A1* | 4/2004 | Umeda | H01L 27/0255 361/56 |
| 2007/0052647 A1* | 3/2007 | Chen | G09G 3/3233 345/92 |
| 2007/0296881 A1 | 12/2007 | Choi et al. | |
| 2012/0161139 A1* | 6/2012 | Endo | H01L 27/1225 257/E29.296 |
| 2013/0057993 A1* | 3/2013 | Fukasaku | H01L 27/0277 361/56 |
| 2015/0091444 A1* | 4/2015 | Ebisuno | H02H 9/044 315/125 |
| 2019/0267801 A1* | 8/2019 | Kumar | H01L 27/0285 |

FOREIGN PATENT DOCUMENTS

| | | |
|---|---|---|
| KR | 10-2007-0119344 A | 12/2007 |
| KR | 10-2012-0031566 A | 4/2012 |
| KR | 10-1197509 B1 | 11/2012 |
| KR | 10-1870995 B1 | 6/2018 |

\* cited by examiner

DISPLAY PANEL AND DISPLAY DEVICE INCLUDING SAME

CROSS-REFERENCE TO RELATED APPLICATIONS

This application claims priority under 35 U.S.C. § 119 to Korean Patent Application No. 10-2022-0042434 filed on Apr. 5, 2022, in the Korean Intellectual Property Office, the disclosures of which are incorporated by reference herein in their entireties.

BACKGROUND

Embodiments of the present disclosure described herein relate to a display device.

In general, a display device includes a display panel for displaying an image and a driving circuit for driving the display panel. The display panel includes a plurality of scan lines, a plurality of data lines, and a plurality of pixels. The driving circuit includes a data driving circuit that outputs data driving signals to the data lines, a scan driving circuit that outputs scan signals for driving the scan lines, and a driving controller for controlling the data driving circuit and the scan driving circuit.

This display device may display an image by outputting a scan signal to a scan line connected to pixels to be displayed and providing data signals to data lines connected to the pixels with data voltages corresponding to the image to be displayed.

SUMMARY

Embodiments of the present disclosure provide a display panel including an electrostatic protection circuit capable of protecting the display panel when static electricity is applied to signal lines for providing signals to the display panel.

Embodiments of the present disclosure provide a display device including a display panel having an electrostatic protection circuit.

According to an embodiment, a display panel includes a first signal line, a second signal line, and an electrostatic protection circuit including a first protection circuit electrically connected between the first signal line and the second signal line. The first protection circuit includes a first transistor connected between the first signal line and the second signal line and including a gate electrode and a lower gate electrode, a first resistor connected between the gate electrode of the first transistor and the second signal line, a first capacitor connected between the gate electrode of the first transistor and the second signal line, and a second capacitor connected between the lower gate electrode of the first transistor and the second signal line. The lower gate electrode of the first transistor receives a reference voltage.

In an embodiment, the first protection circuit may further include a second resistor connected between the lower gate electrode of the first transistor and a reference voltage line receiving the reference voltage.

In an embodiment, in a normal operation state, the first transistor may be maintained in a turn-off state by the reference voltage.

In an embodiment, the first transistor may be an N-type transistor.

In an embodiment, a threshold voltage of the first transistor may have a voltage level higher than a maximum voltage difference between a first signal delivered through the first signal line and a second signal delivered through the second signal line.

In an embodiment, the electrostatic protection circuit may further include a second protection circuit electrically connected between the first signal line and the second signal line. The second protection circuit may include a second transistor connected between the first signal line and the second signal line and including a gate electrode and a lower gate electrode, a third resistor connected between the gate electrode of the second transistor and the first signal line, a third capacitor connected between the gate electrode of the second transistor and the first signal line, and a fourth capacitor connected between the lower gate electrode of the second transistor and the first signal line. The lower gate electrode of the second transistor may receive the reference voltage.

In an embodiment, the second protection circuit may further include a fourth resistor connected between the lower gate electrode of the second transistor and a reference voltage line receiving the reference voltage.

In an embodiment, the second transistor may be an N-type transistor.

In an embodiment, a threshold voltage of the second transistor may have a voltage level higher than a maximum voltage difference between a first signal delivered through the first signal line and a second signal delivered through the second signal line.

In an embodiment, the display panel may further include a plurality of pixels, each of which is connected to a corresponding signal line among the first signal line and the second signal line.

According to an embodiment, a display panel includes a first signal line, a second signal line, a first protection circuit connected between the first signal line and a first node, and a second protection circuit electrically connected between the first node and the second signal line. The first protection circuit includes a first transistor connected between the first signal line and the first node and including a gate electrode and a lower gate electrode, a first resistor connected between the gate electrode of the first transistor and the first node, a first capacitor connected between the gate electrode of the first transistor and the first node, and a second capacitor connected between the lower gate electrode of the first transistor and the first node. The lower gate electrode of the first transistor receives a reference voltage.

In an embodiment, the display panel may further include a third protection circuit connected between the first signal line and a second node and a fourth protection circuit connected between the second node and the second signal line.

According to an embodiment, a display device includes a driving circuit that provides a driving signal, and a display panel electrically connected to the driving circuit through pads. The display panel includes a first data line connected to a first pad among the pads, a second data line connected to a second pad among the pads, and an electrostatic protection circuit including a first protection circuit electrically connected between the first data line and the second data line. The first protection circuit includes a first transistor connected between the first data line and the second data line and including a gate electrode and a lower gate electrode, a first resistor connected between the gate electrode of the first transistor and the second data line, a first capacitor connected between the gate electrode of the first transistor and the second data line, and a second capacitor connected between the lower gate electrode of the first transistor and the second data line. The lower gate electrode of the first transistor receives a reference voltage.

In an embodiment, the display panel may include a pixel. The pixel may include a light emitting element, a first pixel transistor electrically connected to the light emitting element, and a second pixel transistor electrically connected between the first data line and the first pixel transistor.

In an embodiment, each of the first transistor and at least one of the first pixel transistor and the second pixel transistor may be an N-type transistor.

In an embodiment, a threshold voltage of the first transistor may have a voltage level higher than a maximum voltage difference between a first signal delivered through the first data line and a second signal delivered through the second data line.

In an embodiment, the first protection circuit may further include a second resistor connected between the lower gate electrode of the first transistor and a reference voltage line receiving the reference voltage.

In an embodiment, in a normal operation state, the first transistor may be maintained in a turn-off state by the reference voltage.

In an embodiment, the electrostatic protection circuit may further include a second protection circuit electrically connected between the first data line and the second data line. The second protection circuit may include a second transistor connected between the first data line and the second data line and including a gate electrode and a lower gate electrode, a third resistor connected between the gate electrode of the second transistor and the first data line, a third capacitor connected between the gate electrode of the second transistor and the first data line, and a fourth capacitor connected between the lower gate electrode of the second transistor and the first data line. The lower gate electrode of the second transistor may receive the reference voltage.

In an embodiment, the second protection circuit may further include a fourth resistor connected between the lower gate electrode of the second transistor and a reference voltage line receiving the reference voltage.

BRIEF DESCRIPTION OF THE FIGURES

The above and other objects and features of the present disclosure will become apparent by describing in detail embodiments thereof with reference to the accompanying drawings.

DETAILED DESCRIPTION

Figure 1:
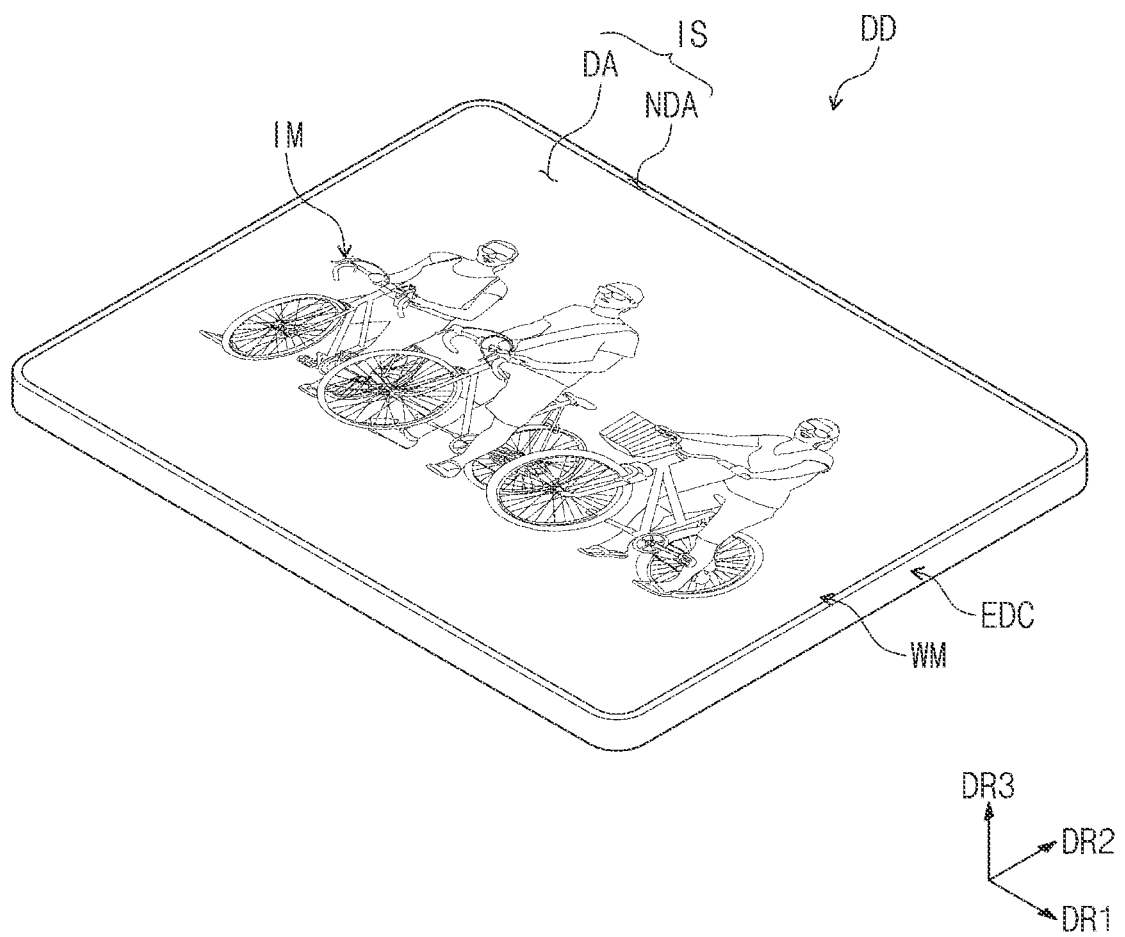
FIG. 1 is a perspective view of a display device according to an embodiment of the present disclosure.

In the specification, the expression that a first component (or region, layer, part, etc.) is "on", "connected with", or "coupled with" a second component means that the first component is directly on, connected with, or coupled with the second component or means that a third component is interposed therebetween.

Like reference numerals refer to like components. Also, in drawings, the thickness, ratio, and dimension of components are exaggerated for effectiveness of description of technical contents. The term "and/or" includes one or more combinations of the associated listed items.

The terms "first", "second", etc. are used to describe various components, but the components are not limited by the terms. The terms are used only to differentiate one component from another component. For example, without departing from the scope and spirit of the present disclosure, a first component may be referred to as a second component, and similarly, the second component may be referred to as the first component. The articles "a," "an," and "the" are singular in that they have a single referent, but the use of the singular form in the specification should not preclude the presence of more than one referent.

Also, the terms "under", "beneath", "on", "above", etc. are used to describe a relationship between components illustrated in a drawing. The terms are relative and are described with reference to a direction indicated in the drawing.

It will be understood that the terms "include", "comprise", "have", etc. specify the presence of features, numbers, steps, operations, elements, or components, described in the specification, or a combination thereof, not precluding the presence or additional possibility of one or more other features, numbers, steps, operations, elements, or components or a combination thereof.

Unless otherwise defined, all terms (including technical terms and scientific terms) used in this specification have the same meaning as commonly understood by those skilled in the art to which the present disclosure belongs. Furthermore, terms such as terms defined in the dictionaries commonly used should be interpreted as having a meaning consistent with the meaning in the context of the related technology, and should not be interpreted in ideal or overly formal meanings unless explicitly defined herein.

Hereinafter, embodiments of the present disclosure will be described with reference to accompanying drawings.

Figure 2:
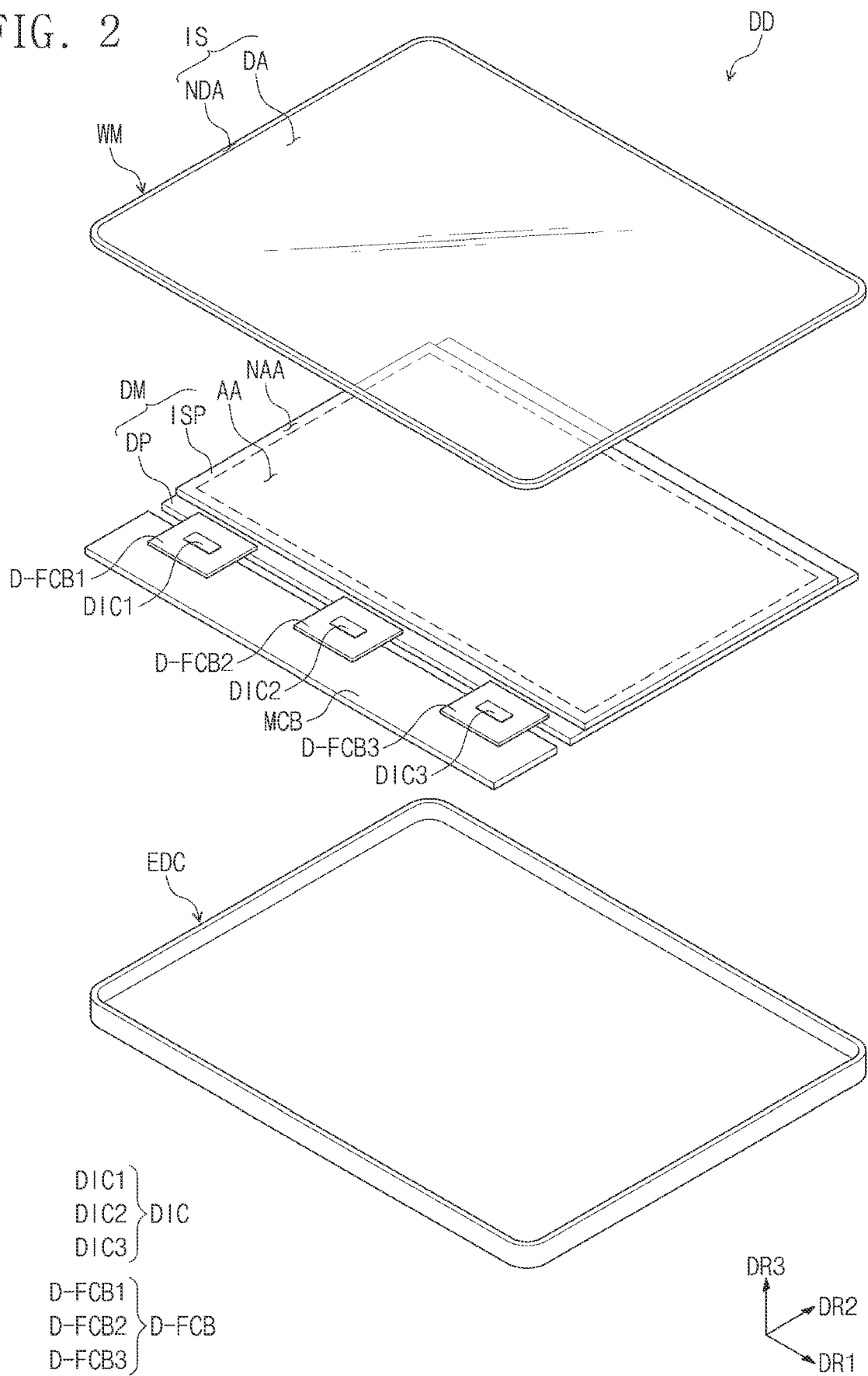
FIG. 2 is an exploded perspective view of a display device according to an embodiment of the present disclosure.

FIG. 1 is a perspective view of a display device according to an embodiment of the present disclosure. FIG. 2 is an exploded perspective view of a display device according to an embodiment of the present disclosure.

Referring to FIGS. 1 and 2, a display device DD may be a device activated depending on an electrical signal. The display device DD according to the present disclosure may be a small and medium-sized electronic device such as a mobile phone, a tablet PC, a notebook computer, a vehicle navigation system, or a game console, as well as a large-sized electronic device such as a television or a monitor. The above examples are provided only as examples, and it is obvious that the display device DD may be applied to any other display device(s) without departing from the concept of the present disclosure. The display device DD is in a shape of a rectangle having a long side in a first direction DR1 and a short side in a second direction DR2 intersecting the first direction DR1. However, the shape of the display device DD is not limited thereto. For example, the display device DD may be implemented in various shapes. The display device DD may display an image IM on a display surface IS, which is parallel to each of the first direction DR1 and the second direction DR2, in a third direction DR3. The display surface IS on which the image IM is displayed may correspond to a front surface of the display device DD.

In an embodiment, a front surface (or an upper/top surface) and a rear surface (or a lower/bottom surface) of each member are defined based on a direction in which the image IM is displayed. The front surface may be opposite to the rear surface in the third direction DR3, and a normal direction of each of the front surface and the rear surface may be parallel to the third direction DR3.

A separation distance between the front surface and the rear surface in the third direction DR3 may correspond to a thickness of the display device DD in the third direction DR3. Meanwhile, directions that the first, second, and third directions DR1, DR2, and DR3 indicate may be relative in concept and may be changed to different directions.

The display device DD may sense an external input applied from the outside. The external input may include various types of inputs that are provided from the outside of the display device DD. The display device DD according to an embodiment of the present disclosure may sense an external input of a user, which is applied from the outside. The external input of the user may be one of various types of external inputs, such as a part of his/her body, light, heat, his/her gaze, and pressure, or a combination thereof. Also, the display device DD may sense the external input of the user applied to a side surface or a rear surface of the display device DD depending on a structure of the display device DD and is not limited to an embodiment. As an example of the present disclosure, an external input may include an input entered from an input device (e.g., a stylus pen, an active pen, a touch pen, an electronic pen, or an E-pen).

The display surface IS of the display device DD may include a display area DA and a non-display area NDA. The display area DA may be an area in which the image IM is displayed. The user perceives (or views) the image IM through the display area DA. In an embodiment, the display area DA is illustrated in the shape of a quadrangle whose vertexes are rounded. However, this is illustrated as an example. The display area DA may have various shapes, not limited to an embodiment.

The non-display area NDA is disposed adjacent to the display area DA. The non-display area NDA may have a given color. The non-display area NDA may surround the display area DA. Accordingly, a shape of the display area DA may be defined substantially by the non-display area NDA. However, this is illustrated as an example. The non-display area NDA may be disposed adjacent to only one side of the display area DA or may be omitted. The display device DD according to an embodiment of the present disclosure may include various embodiments and is not limited to an embodiment.

As illustrated in FIG. 2, the display device DD may include a display module DM and a window WM disposed on the display module DM. The display module DM may include a display panel DP and an input sensing layer ISP.

According to an embodiment of the present disclosure, the display panel DP may include a light emitting display panel. For example, the display panel DP may be an organic light emitting display panel, an inorganic light emitting display panel, a quantum dot light emitting display panel. An emission layer of the organic light emitting display layer may include an organic light emitting material. An emission layer of the inorganic light emitting display panel may include an inorganic light emitting material. An emission layer of the quantum dot light emitting display panel may include a quantum dot, a quantum rod, or the like. Hereinafter, in an embodiment, the description will be given under the condition that the display panel DP is an organic light emitting display panel.

The display panel DP may output the image IM, and the image IM thus output may be displayed through the display surface IS.

The input sensing layer ISP may be disposed on the display panel DP to sense an external input. The input sensing layer ISP may be directly disposed on the display panel DP. According to an embodiment of the present disclosure, the input sensing layer ISP may be formed on the display panel DP by a subsequent process after forming the display panel DP. That is, when the input sensing layer ISP is directly disposed on the display panel DP, an inner adhesive film (not illustrated) is not interposed between the input sensing layer ISP and the display panel DP. In an embodiment, the inner adhesive film may be interposed between the input sensing layer ISP and the display panel DP. In this case, the input sensing layer ISP is not manufactured together with the display panel DP through the subsequent processes. That is, the input sensing layer ISP may be manufactured through a process separate from that of the display panel DP and may then be fixed on an upper surface of the display panel DP by the inner adhesive film.

The window WM may be formed of a transparent material capable of outputting the image IM. For example, the window WM may be formed of glass, sapphire, plastic, etc. It is illustrated that the window WM is implemented with a single layer. However, an embodiment is not limited thereto. For example, the window WM may include a plurality of layers.

In an embodiment, the window WM may include a light blocking pattern for defining the non-display area NDA. The light blocking pattern that is a colored organic film may be formed, for example, in a coating manner.

The window WM may be coupled to the display module DM through an adhesive film. As an example of the present disclosure, the adhesive film may include an optically clear adhesive (OCA) film. However, the adhesive film is not limited thereto. For example, the adhesive film may include a typical adhesive or sticking agent. For example, the adhesive film may include an optically clear resin (OCR) or a pressure sensitive adhesive (PSA) film.

An anti-reflection layer may be further interposed between the window WM and the display module DM. The anti-reflection layer decreases the reflectivity of external light incident from above the window WM. The anti-reflection layer according to an embodiment of the present disclosure may include a retarder and a polarizer. The retarder may have a film type or a liquid crystal coating type. The polarizer may also be a polarizer of a film type or a liquid crystal coating type. The film type may include a stretch-type synthetic resin film, and the liquid crystal coating type may include liquid crystals arranged in a given direction. The retarder and the polarizer may be implemented with one polarization film.

As an example of the present disclosure, the anti-reflection layer may also include color filters. The arrangement of the color filters may be determined in consideration of colors of light generated from a plurality of pixels PX (see FIG. 3) included in the display panel DP. Also, the anti-reflection layer may further include a light blocking pattern.

The display module DM may display the image IM depending on an electrical signal and may transmit/receive information about an external input. The display module DM may be defined by an active area AA and an inactive area NAA. The active area AA may be defined as an area through which the image IM provided from the display area DA is output. Also, the active area AA may be defined as an area in which the input sensing layer ISP senses an external input applied from the outside.

The inactive area NAA is disposed adjacent to the active area AA. For example, the inactive area NAA may surround the active area AA. However, this is illustrated by way of example. The inactive area NAA may be defined in various shapes, not limited to an embodiment. According to an embodiment, the active area AA of the display module DM may correspond to at least part of the display area DA.

The display module DM may further include a main circuit board MCB, flexible circuit films D-FCB, and driver chips DIC. The main circuit board MCB may be connected to the flexible circuit films D-FCB so as to be electrically connected to the display panel DP. The flexible circuit films D-FCB are connected to the display panel DP so as to electrically connect the display panel DP to the main circuit board MCB. The main circuit board MCB may include a plurality of driving elements. The plurality of driving elements may include circuits for driving the display panel DP. The driver chips DIC may be mounted on the flexible circuit films D-FCB, respectively. In an embodiment, the main circuit board MCB may include a driving controller for driving the driving chips DIC and a voltage generator that generates voltages necessary for an operation of the display panel DP.

As an example of the present disclosure, the flexible circuit films D-FCB may include a first flexible circuit film D-FCB1, a second flexible circuit film D-FCB2, and a third flexible circuit film D-FCB3. The driver chips DIC may include a first driver chip DIC1, a second driver chip DIC2, and a third driver chip DIC3. The first to third flexible circuit films D-FCB1, D-FCB2, and D-FCB3 may be positioned spaced from one another in the first direction DR1 and may be connected with the display panel DP so as to electrically connect the display panel DP and the main circuit board MCB. The first driver chip DIC1 may be mounted on the first flexible circuit film D-FCB1. The second driver chip DIC2 may be mounted on the second flexible circuit film D-FCB2. The third driver chip DIC3 may be mounted on the third flexible circuit film D-FCB3. However, an embodiment of the present disclosure is not limited thereto. For example, the display panel DP may be electrically connected with the main circuit board MCB through one flexible circuit film, and only one driver chip may be mounted on the one flexible circuit film. Also, the display panel DP may be electrically connected with the main circuit board MCB through four or more flexible circuit films, and driver chips may be respectively mounted on the flexible circuit films.

A structure in which the first to third driver chips DIC1, DIC2, and DIC3 are respectively mounted on the first to third flexible circuit films D-FCB1, D-FCB2, and D-FCB3 is illustrated in FIG. 2, but the present disclosure is not limited thereto. For example, the first to third driver chips DIC1, DIC2, and DIC3 may be directly mounted on the display panel DP. In this case, a portion of the display panel DP, on which the first to third driver chips DIC1, DIC2, and DIC3 are mounted, may be bent such that the first to third driver chips DIC1, DIC2, and DIC3 are disposed on a rear surface of the display module DM. Also, the first to third driver chips DIC1, DIC2, and DIC3 may be directly mounted on the main circuit board MCB.

The input sensing layer ISP may be electrically connected with the main circuit board MCB through the flexible circuit films D-FCB. However, an embodiment of the present disclosure is not limited thereto. That is, the display module DM may additionally include a separate flexible circuit film for electrically connecting the input sensing layer ISP and the main circuit board MCB.

The display device DD further includes an outer case EDC accommodating the display module DM. The outer case EDC may be coupled with the window WM to define the exterior of the display device DD. The outer case EDC may absorb external shocks and may prevent a foreign material/moisture or the like from being infiltrated into the display module DM such that components accommodated in the outer case EDC are protected. Meanwhile, as an example of the present disclosure, the outer case EDC may be provided in the form of a combination of a plurality of accommodating members.

The display device DD according to an embodiment may further include an electronic module including various functional modules for operating the display module DM, a power supply module (e.g., a battery) for supplying a power necessary for overall operations of the display device DD, a bracket coupled with the display module DM and/or the outer case EDC to partition an inner space of the display device DD, etc.

Figure 3:
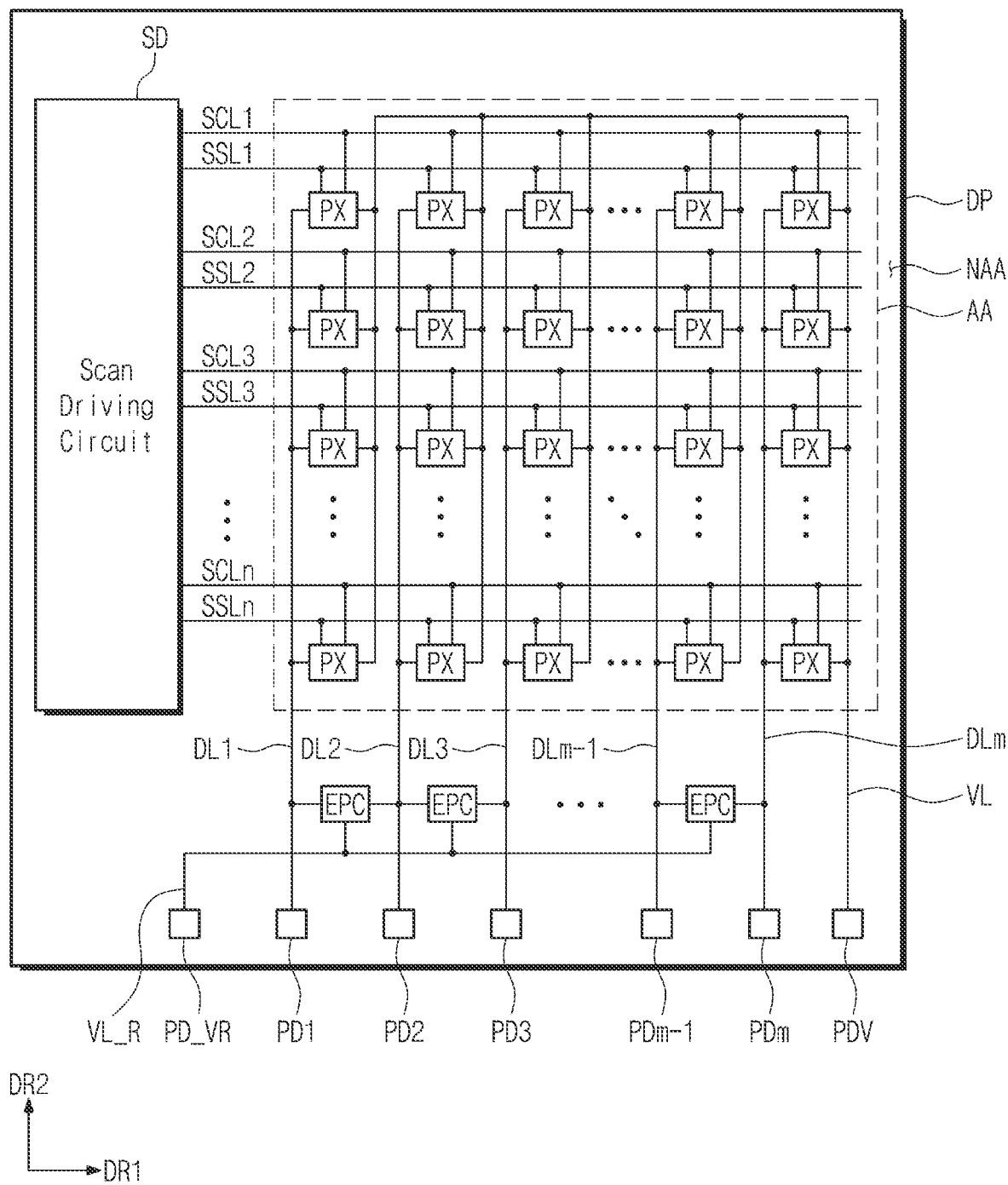
FIG. 3 is a block diagram of a display panel, according to an embodiment of the present disclosure.

FIG. 3 is a block diagram of a display panel, according to an embodiment of the present disclosure.

Referring to FIG. 3, the display panel DP includes first scan lines SCL1 to SCLn, second scan lines SSL1 to SSLn, data lines DL1 to DLm, pixels PX and electrostatic protection circuits EPC. The display panel DP may further include a scan driving circuit SD. In an embodiment, the scan driving circuit SD is arranged on a first side of the display panel DP. The first scan lines SCL1 to SCLn and the second scan lines SSL1 to SSLn extend in the first direction DR1 from the scan driving circuit SD.

The scan driving circuit SD may provide first scan signals and second scan signals to the first scan lines SCL1 to SCLn and the second scan lines SSL1 to SSLn of the display panel DP.

The display panel DP may include the active area AA and the inactive area NAA. The pixels PX may be disposed in the active area AA. The scan driving circuit SD and the electrostatic protection circuits EPC may be disposed in the inactive area NAA.

The first scan lines SCL1 to SCLn and the second scan lines SSL1 to SSLn are positioned spaced from each other in the second direction DR2. The data lines DL1 to DLm extend in the second direction DR2 and are arranged spaced from one another in the first direction DR1.

The plurality of pixels PX are electrically connected to the first scan lines SCL1 to SCLn, the second scan lines SSL1 to SSLn, and the data lines DL1 to DLm. For example, the first row of pixels PX may be connected to the first scan line SCL1 and the second scan line SSL1. Moreover, the second row of pixels PX may be connected to the first scan line SCL2 and the second scan line SSL2.

Each of the plurality of pixels PX includes a light emitting element ED (see FIG. 4) and a pixel circuit PXC (see FIG. 4) for controlling the light emission of the light emitting element ED. The pixel circuit PXC may include a plurality of transistors and at least one capacitor. The scan driving circuit SD may include transistors formed through the same process as the pixel circuit PXC. In an embodiment, the light emitting element ED may be an organic light emitting diode. However, the present disclosure is not limited thereto.

Each of the plurality of the pixels PX may be electrically connected to voltage lines VL that supply a first driving voltage ELVDD, a second driving voltage ELVSS, and an initialization voltage VINT.

In an embodiment, the scan driving circuit SD is disposed on a first side of the display area DA, but the present disclosure is not limited thereto. In an embodiment, the scan driving circuit SD may be disposed not only on the first side of the active area AA but also on a second side facing the first side.

The display panel DP may further include data pads PD1 to PDm, a driving voltage pad PDV, and a reference voltage pad PD_VR. The data pads PD1 to PDm are electrically connected to the data lines DL1 to DLm, respectively. The driving voltage pad PDV may be electrically connected to the voltage lines VL. Only the one driving voltage pad PDV is illustrated in FIG. 3, but the plurality of driving voltage pads PDV may be present. The reference voltage pad PD_VR is electrically connected to a reference voltage line VL_R.

The data pads PD1 to PDm may be electrically connected to the flexible circuit films D-FCB shown in FIG. 2. The driving voltage pad PDV and the reference voltage pad PD_VR may be electrically connected to the main circuit board MCB shown in FIG. 2. In an embodiment, the driving voltage pad PDV and the reference voltage pad PD_VR may be electrically connected to the main circuit board MCB through at least one of the flexible circuit films D-FCB.

Each of the electrostatic protection circuits EPC may be disposed between two corresponding data lines among the data lines DL1 to DLm. Each of the electrostatic protection circuits EPC may be electrically connected to two corresponding data lines among the data lines DL1 to DLm. A detailed circuit configuration and operation of the electrostatic protection circuits EPC will be described in detail later.

Figure 4:
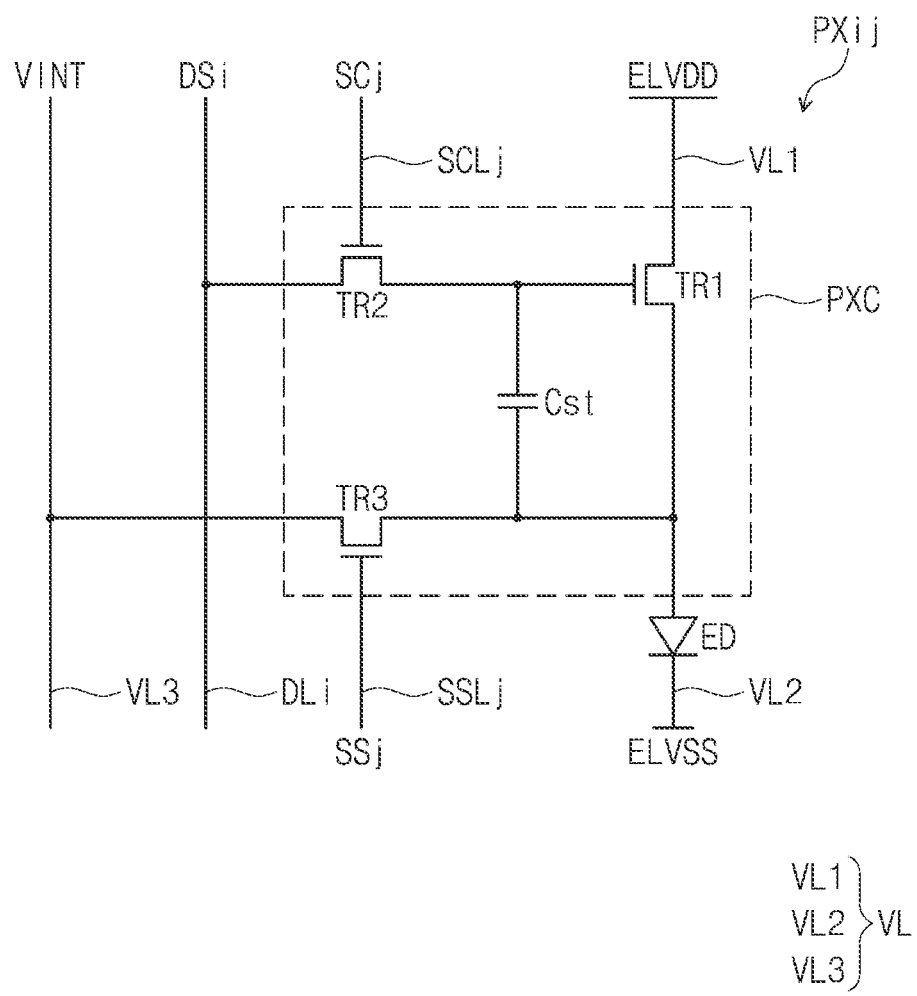
FIG. 4 is a circuit diagram of a pixel, according to an embodiment of the present disclosure.

FIG. 4 is a circuit diagram of a pixel, according to an embodiment of the present disclosure.

FIG. 4 illustrates an equivalent circuit diagram of a pixel PXij connected to an i-th data line DLi among the data lines DL1 to DLm, a j-th first scan line SCLj among the first scan lines SCL1 to SCLn, and a j-th second scan line SSLj among the second scan lines SSL1 to SSLn, which are illustrated in FIG. 1.

Each of the plurality of pixels PX shown in FIG. 3 may have the same circuit configuration as the pixel PXij shown in FIG. 4. In an embodiment, the pixel PXij includes the at least one light emitting element ED and the pixel circuit PXC.

The pixel circuit PXC may include at least one transistor, which is electrically connected to the light emitting element ED and which is used to provide a current corresponding to the data signal DSi delivered from the data line DLi to the light emitting element ED. In an embodiment, the pixel circuit PXC of the pixel PXij includes a first transistor TR1, a second transistor TR2, a third transistor TR3, and a capacitor Cst. Each of the first to third transistors TR1 to TR3 may be referred to as a pixel transistor. Each of the first to third transistors TR1 to TR3 is an N-type transistor by using an oxide semiconductor as a semiconductor layer. However, the present disclosure is not limited thereto. For example, each of the first to third transistors TR1 to TR3 may be a P-type transistor having a low-temperature polycrystalline silicon (LTPS) semiconductor layer. In an embodiment, at least one of the first to third transistors TR1 to TR3 may be an N-type transistor and the others thereof may be P-type transistors. Moreover, the circuit configuration of a pixel according to an embodiment of the present disclosure is not limited to FIG. 4. The pixel circuit PXC illustrated in FIG. 4 is only an example. For example, the configuration of the pixel circuit PXC may be modified and implemented.

Referring to FIG. 4, the first scan line SCLj may deliver the first scan signal SCj, and the second scan line SSLj may deliver the second scan signal SSj. The data line DLi transfers a data signal Di.

The first driving voltage ELVDD and the initialization voltage VINT may be delivered to the pixel circuit PXC through the first voltage line VL1 and the third voltage line VL3 among the voltage lines VL. The second driving voltage ELVSS may be delivered to a cathode (or a second terminal) of the light emitting element ED through the second voltage line VL2 among the voltage lines VL.

The first transistor TR1 includes a first electrode (or a drain electrode) connected to the first voltage line VL1, a second electrode (or a source electrode) electrically connected to an anode (or a first terminal) of the light emitting element ED, and a gate electrode connected to one end of the capacitor Cst. When the second transistor TR2 is turned on, the first transistor TR1 may supply a driving current to the light emitting element ED in response to the data signal DSi delivered through the data line DLi.

The second transistor TR2 includes a first electrode connected to the data line DLi, a second electrode connected to the gate electrode of the first transistor TR1, and a gate electrode connected to the first scan line SCLj. The second transistor TR2 may be turned on in response to a first scan signal SCj received through the first scan line SCLj so as to deliver the data signal DSi delivered through the data line DLi to the gate electrode of the first transistor TR1.

The third transistor TR3 includes a first electrode connected to the third voltage line VL3, a second electrode connected to the anode of the light emitting element ED, and a gate electrode connected to the second scan line SSLj. The third transistor TR3 may be turned on in response to a second scan signal SSj received through the second scan line SSLj so as to deliver the initialization voltage VINT to the anode of the light emitting element ED.

As described above, one end of the capacitor Cst is connected to the gate electrode of the first transistor TR1, and the other end of the capacitor Cst is connected to the second electrode of the first transistor TR1. The structure of the pixel PXij according to an embodiment is not limited to the structure illustrated in FIG. 4. The number of transistors in the pixel PXij included in the pixel circuit PXC, the number of capacitors included therein, and the connection relationship may be modified in various manners.

Figure 5:
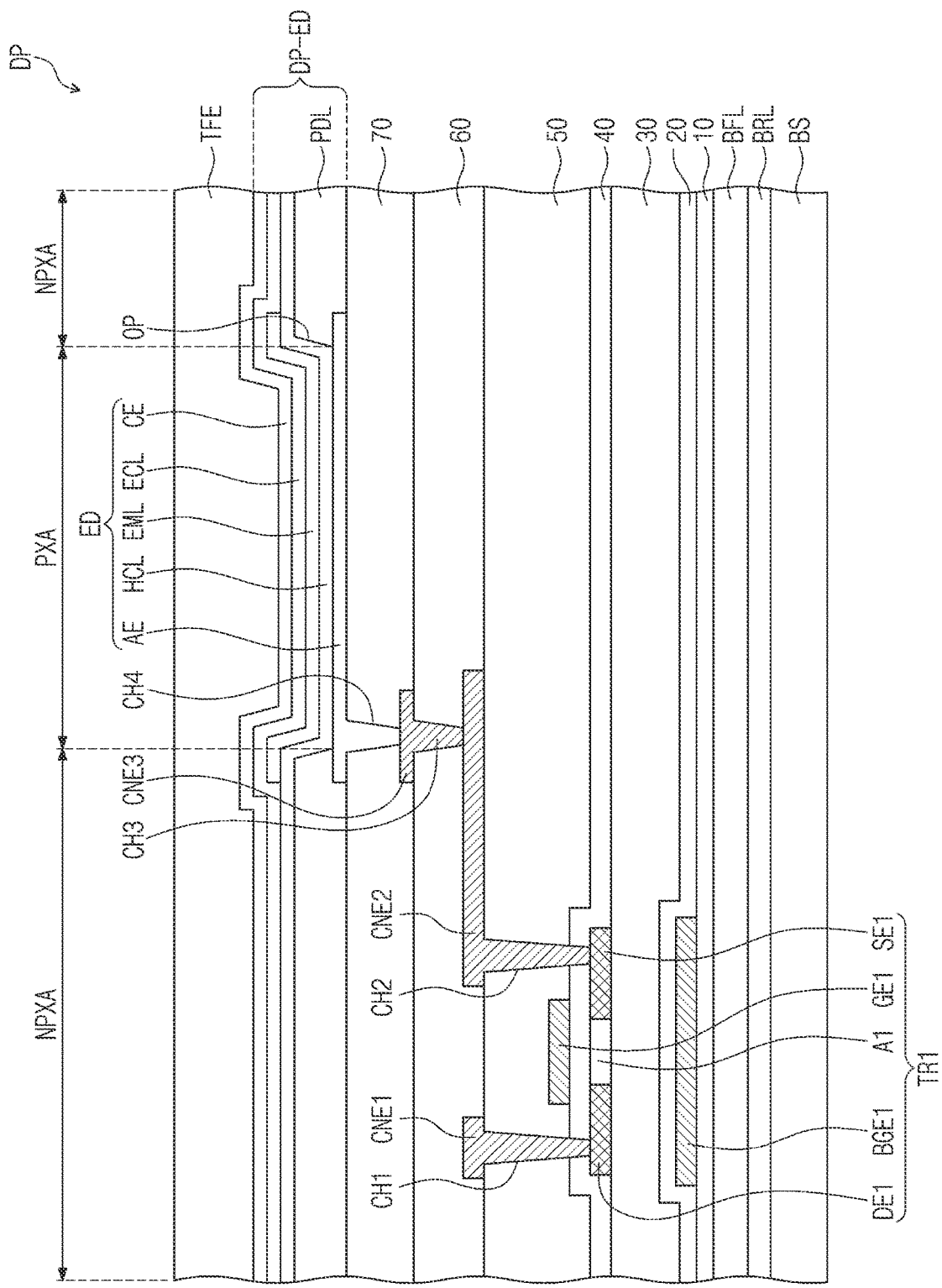
FIG. 5 is a cross-sectional view of a portion corresponding to some configurations of a pixel of a display panel shown in FIG. 4.

FIG. 5 is a cross-sectional view of a portion corresponding to corresponding to some configurations of the pixel PXij of the display panel shown in FIG. 4.

Referring to FIGS. 4 and 5, the display panel DP may include a base layer BS, a circuit element layer disposed on the base layer BS, a display element layer DP-ED, and a thin film encapsulation layer TFE. The display panel DP may further include functional layers such as an anti-reflection layer, a refractive-index adjustment layer, or the like. The circuit element layer includes at least a plurality of insulating layers and a circuit element. The insulating layers described below may include an organic layer and/or an inorganic layer.

An insulating layer, a semiconductor layer, and a conductive layer are formed through processes such as a coating process, a deposition process, and the like. Afterward, the insulating layer, the semiconductor layer, and the conductive layer may be selectively patterned through photolithography processes. A semiconductor pattern, a conductive pattern, and a signal line are formed through the photolithography processes. Patterns disposed on the same layer may be formed through the same process or different processes.

The base layer BS may include a synthetic resin film. The synthetic resin layer may include a thermosetting resin. In detail, the synthetic resin layer may be a polyimide-based resin layer, and the material thereof is not particularly limited thereto. The synthetic resin layer may include at least one of acrylate-based resin, methacrylate-based resin, polyisoprene-based resin, vinyl-based resin, epoxy-based resin, urethane-based resin, cellulose-based resin, siloxane-based resin, polyamide-based resin, and perylene-based resin. Besides, the base layer BS may include a glass substrate, a metal substrate, an organic/inorganic composite substrate, or the like.

At least one inorganic layer is formed on an upper surface of the base layer BS. The inorganic layer may include at least one of aluminum oxide, titanium oxide, silicon oxide, silicon nitride, silicon oxynitride, zirconium oxide, and hafnium oxide. The inorganic layer may be formed of multiple layers. The multiple inorganic layers may constitute a barrier layer BRL and/or a buffer layer BFL, which will be described later. The barrier layer BRL and the buffer layer BFL may be sequentially disposed on the BS.

The barrier layer BRL prevents foreign objects from being entered from the outside. The barrier layer BRL may include a silicon oxide layer and a silicon nitride layer. Each of the silicon oxide layer and the silicon nitride layer may include a plurality of layers, and the plurality of silicon oxide layers and the silicon nitride layers may be alternately stacked.

The buffer layer BFL is disposed on the barrier layer BRL. The buffer layer BFL improves a bonding force between the base layer BS and a semiconductor pattern and/or a conductive pattern. The buffer layer BFL may include a silicon oxide layer and a silicon nitride layer. The silicon oxide layer and the silicon nitride layer may be alternately stacked. One of the barrier layer BRL and the buffer layer BFL may be omitted.

A first insulating layer 10 is disposed on the buffer layer BFL.

A conductive layer (hereinafter, referred to as a "first conductive layer") is disposed on the first insulating layer 10. In FIG. 4, it is illustrated that the lower gate electrode BGE1 is a conductive pattern of the first conductive layer. A second insulating layer 20 covering the lower gate electrode BGE1 is disposed on the first insulating layer 10. Third to seventh insulating layers 30 to 70 are sequentially disposed on the second insulating layer 20. Each of the first to seventh insulating layers 10 to 70 may be an inorganic layer and/or an organic layer.

A semiconductor layer is disposed on the third insulating layer 30. The semiconductor layer may include a plurality of semiconductor patterns. The semiconductor pattern may include metal oxide semiconductor. The metal oxide semiconductor may include a crystalline or amorphous oxide semiconductor. For example, the oxide semiconductor may include oxides of metals (e.g., zinc (Zn), indium (In), gallium (Ga), tin (Sn), titanium (Ti), and the like) or a mixture of the metals (e.g., zinc (Zn), indium (In), gallium (Ga), tin (Sn), titanium (Ti), and the like) and oxides of the metals. The oxide semiconductors may include indium-tin oxide (ITO), indium-gallium-zinc oxide (IGZO), zinc oxide (ZnO), indium-zinc oxide (IZnO), zinc-indium oxide (ZIO), indium oxide (InO), titanium oxide (TiO), indium-zinc-tin oxide (IZTO), zinc-tin oxide (ZTO), and the like.

The semiconductor pattern may include a plurality of areas identified depending on whether the metal oxide is reduced. An area in which the metal oxide is reduced (hereinafter referred to as a "reduction area") has higher conductivity than an area in which the metal oxide is not reduced (hereinafter referred to as a "non-reduction area"). The reduction area substantially serves as a first electrode (or source)/second electrode (or drain) or a signal line of a transistor. The non-reduction area substantially corresponds to a semiconductor area (or channel) of a transistor. In other words, a part of the semiconductor pattern may be the semiconductor area of the transistor; another part may be the first electrode/second electrode of the transistor; and, the other part may be the signal transmission area.

As shown in FIG. 5, a first electrode DE1, a semiconductor area A1, and a second electrode SE1 of the first transistor TR1 are formed from semiconductor patterns. The first electrode DE1 and the second electrode SE1 of the first transistor TR1 extend in opposite directions from the semiconductor area A1.

The lower gate electrode BGE1 has a function of a light blocking pattern. The lower gate electrode BGE1 is disposed under the semiconductor area A1 of the first transistor TR1 so as to block light incident from the outside. The light blocking pattern prevents external light from changing voltage-current characteristics of the first transistor TR1.

The fourth insulating layer 40 covering the semiconductor pattern is disposed on the third insulating layer 30.

A conductive layer (hereinafter, referred to as a "second conductive layer") is disposed on the fourth insulating layer 40. The second conductive layer may include a plurality of conductive patterns. In an embodiment, the second conductive layer may include a gate electrode GE1 of the first transistor TR1.

The fifth insulating layer 50 covering the gate electrode GE1 of the first transistor TR1 is disposed on the fourth insulating layer 40.

A conductive layer (hereinafter, referred to as a "third conductive layer") is disposed on the fifth insulating layer 50. The third conductive layer may include first and second connection electrodes CNE1 and CNE2.

The first connection electrode CNE1 is connected to the first electrode DE1 of the first transistor TR1 through a contact hole CH1 formed through the fourth and fifth insulating layers 40 and 50. The second connection electrode CNE2 is connected to the second electrode SE1 of the first transistor TR1 through a contact hole CH2 formed through the fourth and fifth insulating layers 40 and 50.

The sixth insulating layer 60 covering the first and second connection electrodes CNE1 and CNE2 is disposed on the fifth insulating layer 50.

A conductive layer (hereinafter, referred to as a "fourth conductive layer") is disposed on the sixth insulating layer 60. The fourth conductive layer may include a third connection electrode CNE3. The third connection electrode CNE3 is connected to the second connection electrode CNE2 through a contact hole CH3 formed through the sixth insulating layer 60.

The seventh insulating layer 70 covering the third connection electrode CNE3 is disposed on the sixth insulating layer 60.

A first electrode AE of the light emitting element ED is disposed on the seventh insulating layer 70. The first electrode AE may be an anode. The first electrode AE is connected to the third connection electrode CNE3 through a contact hole CH4 formed through the seventh insulating layer 70.

A pixel defining layer PDL is disposed on the seventh insulating layer 70 on the first electrode AE. The opening OP of the pixel defining layer PDL exposes at least part of the first electrode AE. The opening OP of the pixel defining layer PDL may define an emission area PXA. For example, the plurality of pixels PX (see FIG. 3) may be arranged on a plane of the display panel DP (see FIG. 3) depending on a specific rule. Each of areas in which the plurality of pixels PX are arranged may be defined as a pixel area. One pixel area may include the emission area PXA and a non-emission area NPXA disposed adjacent to the emission area PXA. The non-emission area NPXA may surround the emission area PXA.

A hole control layer HCL may be disposed in common in the emission area PXA and the non-emission area NPXA. A common layer such as the hole control layer HCL may be formed in common in the plurality of pixels PX. The hole control layer HCL may include a hole transport layer and a hole injection layer.

A light emitting layer EML is disposed on the hole control layer HCL. The light emitting layer EML may be disposed in only an area corresponding to the opening OP. The light emitting layer EML may be separately formed in each of the plurality of pixels PX.

In an embodiment, the patterned light emitting layer EML is illustrated. However, the light emitting layer EML may be disposed in the plurality of pixels PX in common. The emission layer EML that is disposed in common may generate white light or blue light. Also, the light emitting layer EML may have a multi-layer structure.

An electron control layer ECL is disposed on the light emitting layer EML. The electron control layer ECL may include an electron transport layer and an electron injection layer. A second electrode CE is disposed on the electron control layer ECL. The electronic control layer ECL and the second electrode CE are disposed in the plurality of pixels PX in common.

The thin film encapsulation layer TFE is disposed on the second electrode CE. The thin film encapsulation layer TFE is disposed in the plurality of pixels PX in common. In an embodiment, the thin film encapsulation layer TFE directly covers the second electrode CE. In an embodiment of the present disclosure, a capping layer directly covering the second electrode CE may be further disposed. In an embodiment of the present disclosure, the stacked structure of the light emitting element ED may have a structure thus vertically inverted in the structure shown in FIG. 4.

The thin film encapsulation layer TFE includes at least one inorganic layer or at least one organic layer. In an embodiment of the present disclosure, the thin film encapsulation layer TFE may include two inorganic layers and an organic layer disposed therebetween. In an embodiment of the present disclosure, the thin film encapsulation layer TFE may include a plurality of inorganic layers and a plurality of organic layers which are alternately stacked.

Figure 6:
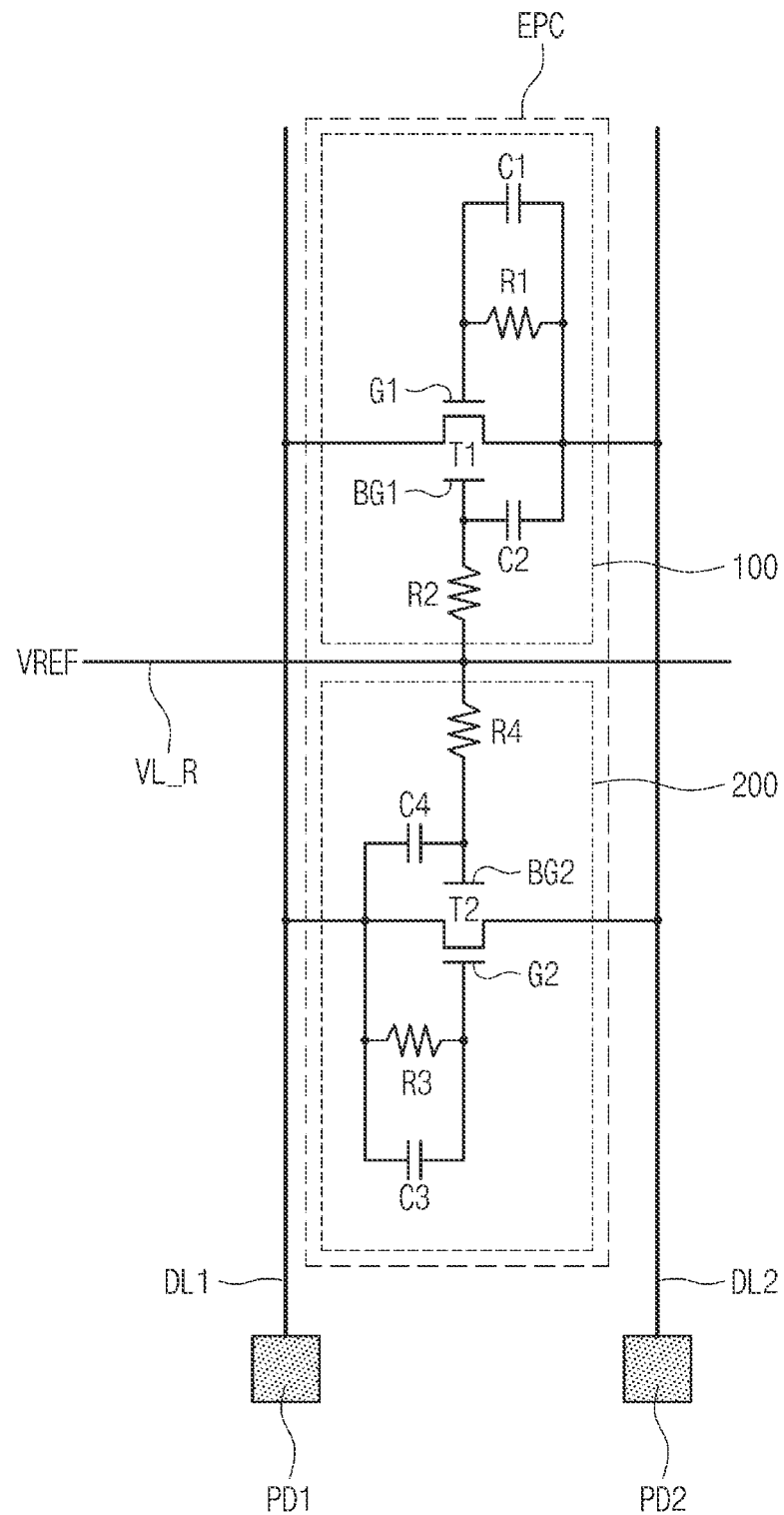
FIG. 6 is a circuit diagram of an electrostatic protection circuit according to an embodiment of the present disclosure.

FIG. 6 is a circuit diagram of an electrostatic protection circuit EPC according to an embodiment of the present disclosure.

Referring to FIG. 6, the electrostatic protection circuit EPC includes a first protection circuit 100 and a second protection circuit 200. The first protection circuit 100 is electrically connected between the first data line DL1 and the second data line DL2.

The first protection circuit 100 includes a first transistor T1, a first resistor R1, a second resistor R2, a first capacitor C1, and a second capacitor C2. The first transistor T1 is connected between the first data line DL1 and the second data line DL2, and includes a gate electrode G1 and a lower gate electrode BG1. In an embodiment, the first transistor T1 is an N-type transistor by using an oxide semiconductor as a semiconductor layer. In an embodiment, the first transistor T1 may be formed through the same process as the first to third transistors TR1 to TR3 in the pixel PXij illustrated in FIG. 3.

The first resistor R1 is connected between the gate electrode G1 of the first transistor T1 and the second data line DL2. The second resistor R2 is connected between the lower gate electrode BG1 of the first transistor T1 and a reference voltage line VL_R.

The first capacitor C1 is connected between the gate electrode G1 of the first transistor T1 and the second data line DL2. The second capacitor C2 is connected between the lower gate electrode BG1 of the first transistor T1 and the second data line DL2.

The second protection circuit 200 includes a second transistor T2, a third resistor R3, a fourth resistor R4, a third capacitor C3, and a fourth capacitor C4. The second transistor T2 is connected between the first data line DL1 and the second data line DL2, and includes a gate electrode G2 and a lower gate electrode BG2. In an embodiment, the second transistor T2 is an N-type transistor by using an oxide semiconductor as a semiconductor layer. In an embodiment, the second transistor T2 may be formed through the same process as the first to third transistors TR1 to TR3 in the pixel PXij illustrated in FIG. 3.

The third resistor R3 is connected between the gate electrode G2 of the second transistor T2 and the first data line DL1. The fourth resistor R4 is connected between the lower gate electrode B G2 of the second transistor T2 and the reference voltage line VL_R.

The third capacitor C3 is connected between the gate electrode G2 of the second transistor T2 and the first data line DL1. The fourth capacitor C4 is connected between the lower gate electrode BG2 of the second transistor T2 and the first data line DL1.

In a normal operation mode (i.e., in a state where static electricity is not applied to the first data line DL1 and the second data line DL2 through the data pads PD1 and PD2), both the first transistor T1 and the second transistor T2 need to be turned off.

Because each of the first transistor T1 and the second transistor T2 is an N-type transistor, a threshold voltage (referred to as "Vth") of each of the first transistor T1 and the second transistor T2 may be lower than 0 V. In this case, when a gate-source voltage of each of the first transistor T1 and the second transistor T2 is 0 V, a leakage current may flow through the first transistor T1 and the second transistor T2.

The threshold voltage Vth of each of the first transistor T1 and the second transistor T2 needs to be positively shifted to a voltage higher than 0 V such that the first transistor T1 and the second transistor T2 are turned off in the normal operation state.

One of methods for positively shifting the threshold voltage Vth of each of the first transistor T1 and the second transistor T2 is increasing a channel length of each of the first transistor T1 and the second transistor T2. However, the increase in the channel length of each of the first transistor T1 and the second transistor T2 causes an increase in the circuit area of the electrostatic protection circuit EPC, and thus there is a limit to increasing the channel length.

Another method thereof for positively shifting the threshold voltage Vth of each of the first transistor T1 and the second transistor T2 is lowering a voltage level of a voltage supplied to the lower gate electrode BG1 of the first transistor T1 and the lower gate electrode BG2 of the second transistor T2.

In an embodiment, the reference voltage VREF provided to the reference voltage line VL_R may be set to a level that is lower than the lowest voltage level of each of the first data signal DS1 delivered through the first data line DL1 and the second data signal DS2 delivered through the second data line DL2.

Furthermore, a voltage level of the threshold voltage Vth of each of the first transistor T1 and the second transistor T2 needs to be higher than a difference between the maximum voltage (referred to as "VH") and the minimum voltage (referred to as "VL") of each of the first data signal DS1 and the second data signal DS2 such that the first transistor T1 and the second transistor T2 are turned off in a normal operation state (Vth>(VH−VL)). For example, when the highest voltage of each of the first data signal DS1 and the second data signal DS2 is 5 V and the lowest voltage thereof is 0 V, the voltage level of the reference voltage VREF needs to be set such that the threshold voltage Vth of each of the first transistor T1 and the second transistor T2 is higher than 5 V.

FIGS. 7A, 7B, 8A and 8B are diagrams for describing an operation of an electrostatic protection circuit when static electricity is applied to the first data line or the second data line DL2.

Figure 7A:
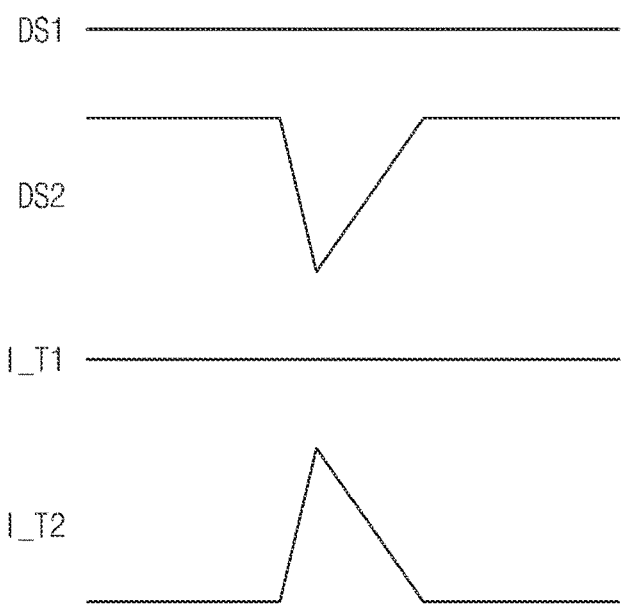
FIGS. 7A, 7B, 8A and 8B are diagrams for describing an operation of an electrostatic protection circuit when static electricity is applied to a first data line or a second data line.

First of all, referring to FIGS. 6 and 7A, when negative static electricity is applied to the second data line DL2, the voltage level of the second data signal DS2 delivered through the second data line DL2 may decrease excessively. When the voltage level of the second data signal DS2 is lowered, the gate-source voltage of the second transistor T2 increases to turn on the second transistor T2. As the second transistor T2 is turned on, a current I_T2 flows from the first data line DL1 to the second data line DL2 through the second transistor T2, and the voltage level of the second data line DL2 increases. Accordingly, it is possible to minimize the influence of the sudden voltage/current change of the second data line DL2 on the display panel DP (see FIG. 3).

Figure 7B:
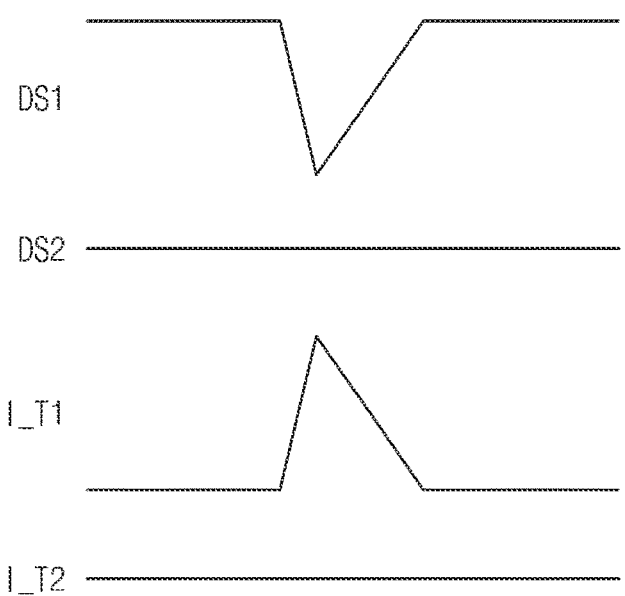

On the other hand, referring to FIGS. 6 and 7B, when negative static electricity is applied to the first data line DL1, the voltage level of the first data signal DS1 delivered through the first data line DL1 may decrease excessively. When the voltage level of the first data signal DS1 is lowered, the gate-source voltage of the first transistor T1 increases to turn on the first transistor T1. As the first transistor T1 is turned on, a current I_T1 flows from the second data line DL2 to the first data line DL1 through the first transistor T1(, and the voltage level of the first data line DL1 increases. Accordingly, it is possible to minimize the influence of the sudden voltage/current change of the first data line DL1 on the display panel DP (see FIG. 3).

Figure 8A:
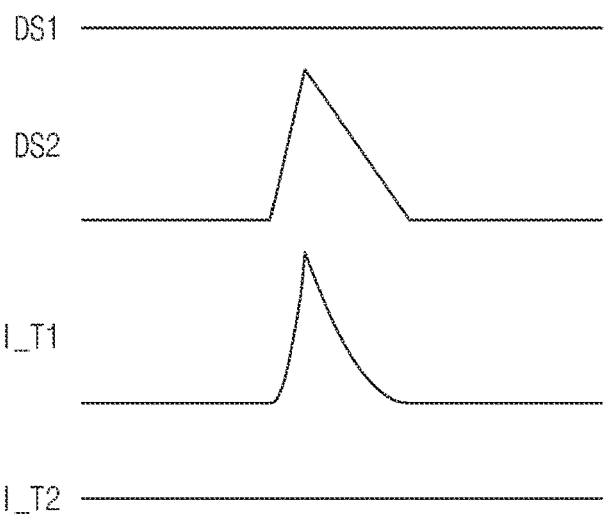

Referring to FIGS. 6 and 8A, when positive static electricity is applied to the second data line DL2, the voltage level of the second data signal DS2 delivered through the second data line DL2 may increase excessively. When the voltage level of the second data signal DS2 increases, the gate-source voltage of the first transistor T1 increases to turn on the first transistor T1. As the first transistor T1 is turned on, the current I_T1 flows from the second data line DL2 to the first data line DL1 through the first transistor T1. Accordingly, the overvoltage/overcurrent of the second data line DL2 may not flow into the display panel DP (see FIG. 3), or the amount of flow flowing into the display panel DP may be minimized.

Figure 8B:
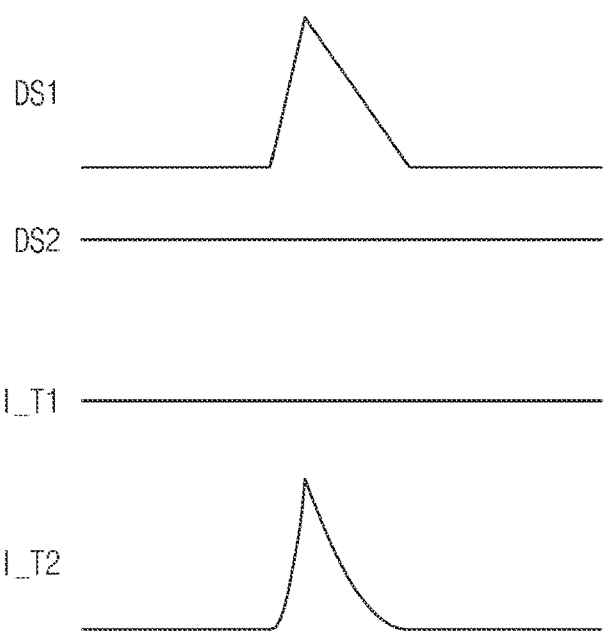

On the other hand, referring to FIGS. 6 and 8B, when positive static electricity is applied to the first data line DL1, the voltage level of the first data signal DS1 delivered through the first data line DL1 may increase excessively. When the voltage level of the first data signal DS1 increases, the gate-source voltage of the second transistor T2 increases to turn on the second transistor T2. As the second transistor T2 is turned on, the current I_T2 flows from the first data line DL1 to the second data line DL2 through the second transistor T2. Accordingly, the overvoltage/overcurrent of the first data line DL1 may not flow into the display panel DP (see FIG. 3), or the amount of flow flowing into the display panel DP may be minimized.

In the meantime, when the voltage level of the first data signal DS1 increases excessively when positive static electricity flows into the first data line DL1, the current flowing through the third resistor R3 is converted to thermal energy, which may damage the third resistor R3. That is, the third resistor R3 may operate as a fuse. Although the third resistor R3 is damaged, it is possible to prevent the display panel DP (see FIG. 3) from being damaged by the static electricity.

When the voltage level of the first data signal DS1 increases again excessively due to positive static electricity in a state where the third resistor R3 is damaged by static electricity, the voltage of the gate electrode G2 of the second transistor T2 is boosted by the third capacitor C3. As a result, as the second transistor T2 is turned on, a current may flow from the first data line DL1 to the second data line DL2, and thus the voltage level of the first data signal DS1 may decrease.

When the voltage level of the second data signal DS2 increases excessively when positive static electricity flows into the second data line DL2, the current flowing through the first resistor R1 is converted to thermal energy, which may damage the first resistor R1. That is, the first resistor R1 may operate as a fuse. Although the first resistor R1 is damaged, it is possible to prevent the display panel DP (see FIG. 3) from being damaged by the static electricity.

When the voltage level of the second data signal DS2 increases again excessively due to positive static electricity in a state where the first resistor R1 is damaged by static electricity, the voltage of the gate electrode G1 of the first transistor T1 is boosted by the first capacitor C1. As a result, as the first transistor T1 is turned on, a current may flow from the second data line DL2 to the first data line DL1, and thus the voltage level of the second data signal DS2 may decrease.

In other words, even when static electricity is applied again in a state where the first resistor R1 and/or the third resistor R3 is damaged, it is possible to prevent the static electricity from being applied to the display panel DP (see FIG. 3) by the third capacitor C3 and/or the first capacitor C1.

When static electricity is applied through the reference voltage line VL_R, each of the second resistor R2 and the fourth resistor R4 may operate as a fuse. That is, when the voltage level of the reference voltage VREF delivered through the reference voltage line VL_R increases excessively, a current flowing through the second resistor R2 and the fourth resistor R4 may be converted into thermal energy, and thus the second resistor R2 and the fourth resistor R4 may be damaged. Even when the second resistor R2 and the fourth resistor R4 are damaged, it is possible to prevent the first transistor T1 and the second transistor T2 from being damaged by static electricity.

Figure 9:
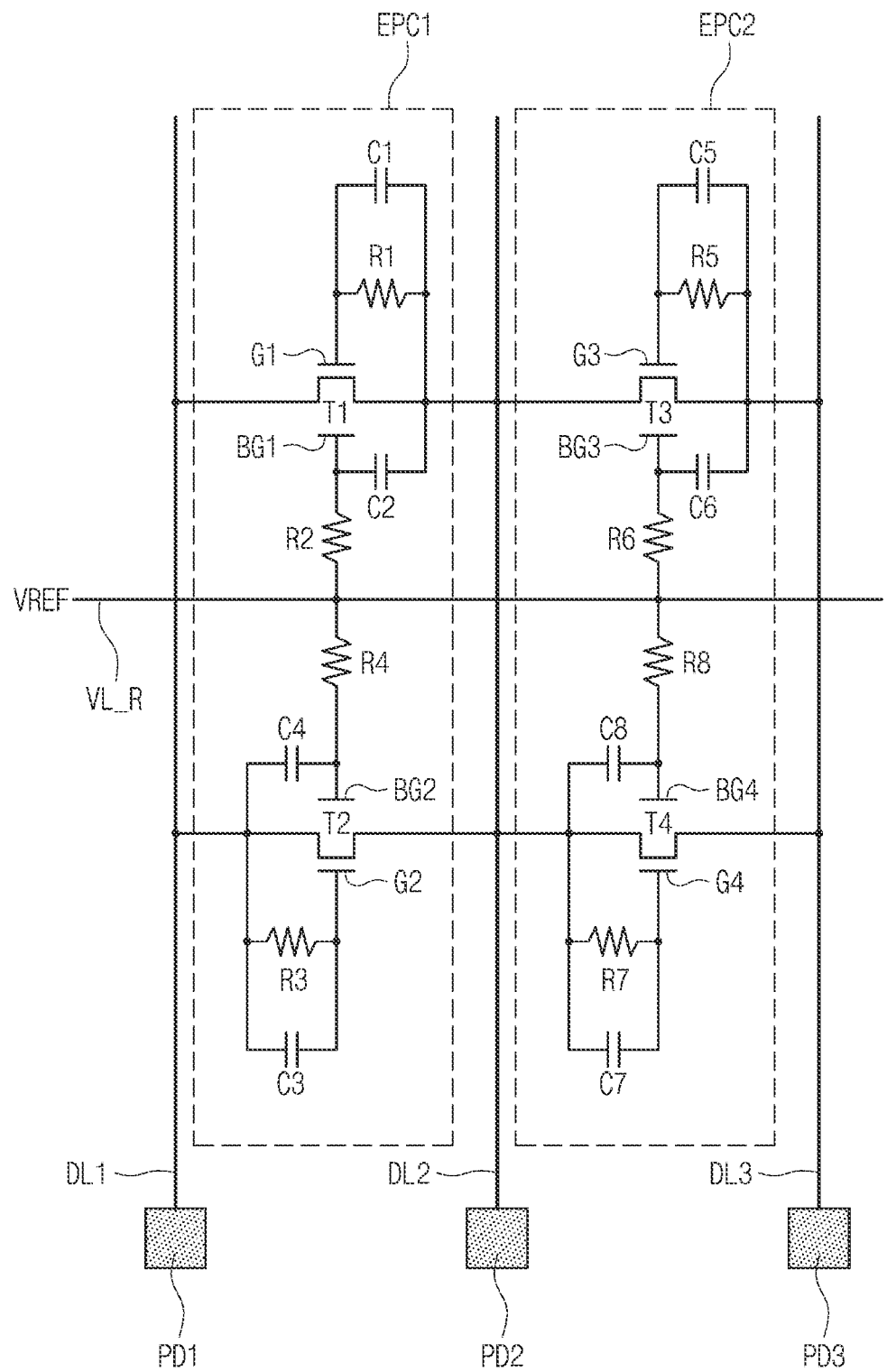
FIG. 9 illustrates first and second electrostatic protection circuits positioned between first to third data lines.

FIG. 9 illustrates first and second electrostatic protection circuits positioned between first to third data lines.

Referring to FIG. 9, a first electrostatic protection circuit EPC1 is electrically connected between the first data line DL1 and the second data line DL2. The first electrostatic protection circuit EPC1 includes the first transistor T1, the second transistor T2, resistors R1, R2, R3, and R4, and capacitors C1, C2, C3, and C4. The circuit configuration and operation of the first electrostatic protection circuit EPC1 are similar to those of the electrostatic protection circuit EPC shown in FIG. 6, and thus a redundant description will be omitted.

A second electrostatic protection circuit EPC2 is electrically connected between the second data line DL2 and the third data line DL3. The second electrostatic protection circuit EPC2 includes the fifth transistor T5, the sixth transistor T6, resistors R5, R6, R7, and R8, and capacitors C5, C6, C7, and C8. The circuit configuration and operation of the first electrostatic protection circuit EPC2 are similar to those of the electrostatic protection circuit EPC shown in FIG. 6, and thus a redundant description will be omitted.

When positive static electricity is applied to the first data line DL1, the voltage level of the first data signal DS1 delivered through the first data line DL1 may increase excessively. When the voltage level of the first data signal DS1 increases, the gate-source voltage of the second transistor T2 in the first electrostatic protection circuit EPC1 increases to turn on the second transistor T2. As the second transistor T2 is turned on, the current of the first data line DL1 flows to the second data line DL2 through the second transistor T2. When the voltage level of the second data line DL2 increases, the fourth transistor T4 in the second electrostatic protection circuit EPC2 is turned on. As the fourth transistor T4 is turned on, the current of the second data line DL2 flows to the third data line DL3 through the fourth transistor T4. Accordingly, the overvoltage/overcurrent of the first data line DL1 may be distributed to the second data line DL2 and the third data line DL3. As a result, it is possible to more effectively prevent the overvoltage/overcurrent from flowing into the display panel DP (see FIG. 3).

Figure 10:
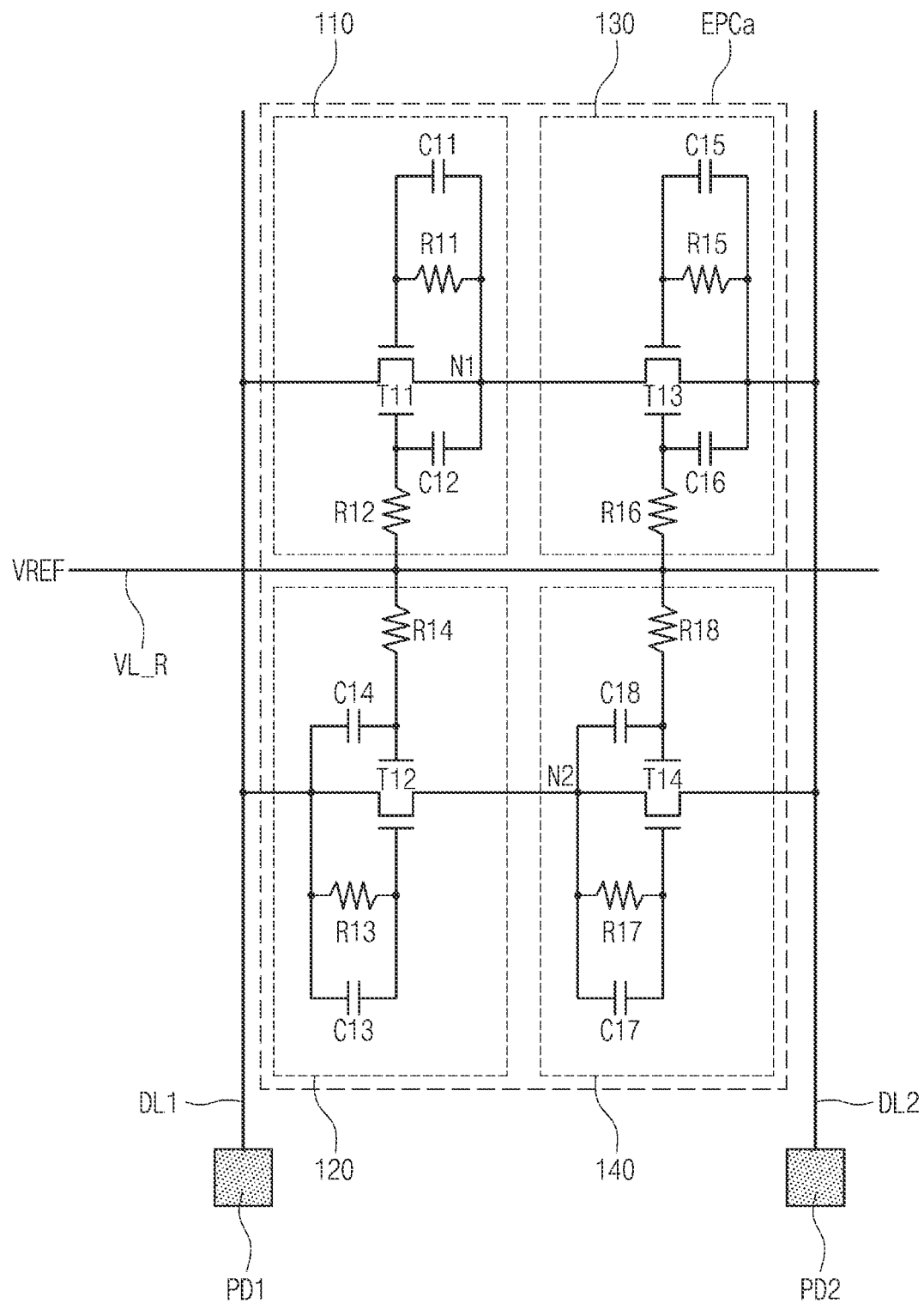
FIG. 10 shows an electrostatic protection circuit, according to an embodiment of the present disclosure.

FIG. 10 shows an electrostatic protection circuit, according to an embodiment of the present disclosure.

Referring to FIG. 10, an electrostatic protection circuit EPCa is electrically connected between the first data line DL1 and the second data line DL2. The electrostatic protection circuit EPCa includes a first protection circuit 110, a second protection circuit 120, a third protection circuit 130, and a fourth protection circuit 140.

The first protection circuit 110 includes a first transistor T11, a first resistor R11, a second resistor R12, a first capacitor C11, and a second capacitor C12. The second protection circuit 120 includes a second transistor T12, a third resistor R13, a fourth resistor R14, a third capacitor C13, and a fourth capacitor C14. The third protection circuit 130 includes a third transistor T13, a fifth resistor R15, a sixth resistor R16, a fifth capacitor C15, and a sixth capacitor C16. The fourth protection circuit 140 includes a fourth transistor T14, a seventh resistor R17, an eighth resistor R18, a seventh capacitor C17, and an eighth capacitor C18.

The first protection circuit 110 is connected between the first data line DL1 and a first node N1. The second protection circuit 120 is connected between the first data line DL1 and a second node N2. The third protection circuit 130 is connected between the first node N1 and the second data line DL2. The fourth protection circuit 140 is connected between the second node N2 and the second data line DL2.

That is, the first protection circuit 110 and the third protection circuit 130 may be sequentially connected between the first data line DL1 and the second data line DL2. The second protection circuit 120 and the fourth protection circuit 140 may be sequentially connected between the first data line DL1 and the second data line DL2.

A voltage level of the sum (Vth1+Vth3) of the threshold voltage of the first transistor T11 (referred to as "Vth1") and the threshold voltage of the third transistor T13 (referred to as "Vth3") needs to be higher than a difference between the highest voltage (referred to as "VH") and the lowest voltage (referred to as "VL") of each of the first data signal DS1 and the second data signal DS2 (condition 1: (Vth1+Vth3)>(VH−VL)).

Likewise, a voltage level of the sum (Vth2+Vth4) of the threshold voltage of the second transistor T12 (referred to as "Vth2") and the threshold voltage of the fourth transistor T14 (referred to as "Vth4") needs to be higher than a difference between the highest voltage and the lowest voltage of each of the first data signal DS1 and the second data signal DS2 (condition 2: (Vth2+Vth4)>(VH−VL)).

It is desirable that the reference voltage VREF is set to a voltage level that satisfies both condition 1 and condition 2.

FIG. 10 illustrates that the first to fourth protection circuits 110, 120, 130, and 140 are positioned between the first data line DL1 and the second data line DL2, but the present disclosure is not limited thereto. A plurality of protection circuits may be positioned between the first data line DL1 and the second data line DL2.

Besides, in this specification, it is described that the electrostatic protection circuits EPC, EPC1, EPC2, and EPCa are positioned between two data lines, but the present disclosure is not limited thereto. That is, the electrostatic protection circuits EPC, EPC1, EPC2, and EPCa of the present disclosure may be positioned between two signal lines (e.g. scan lines or control signal lines) positioned adjacent to each other.

Figure 11:
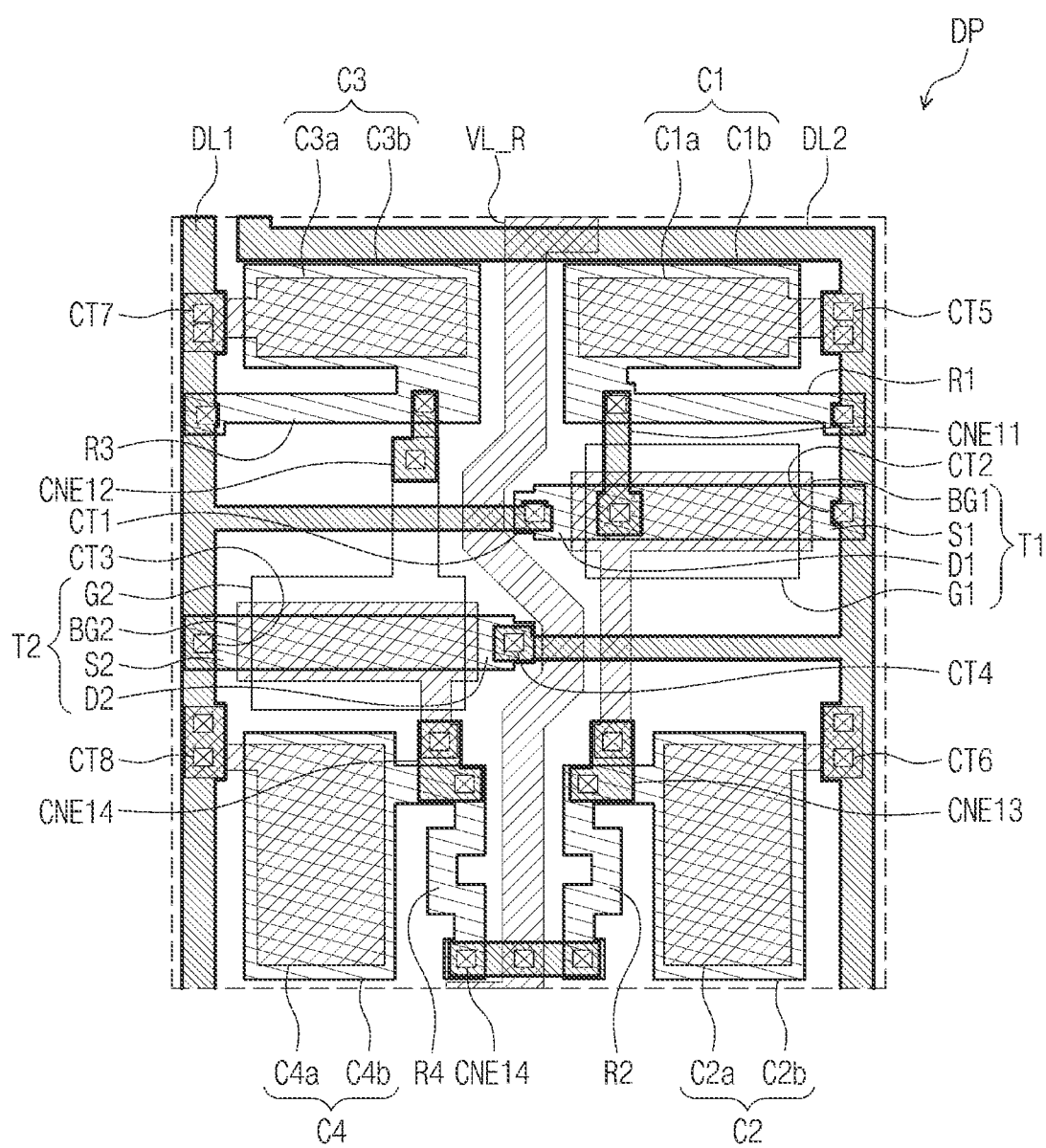
FIG. 11 is a plan view of a display panel, according to an aspect of the present disclosure.

FIG. 11 is a plan view of a display panel, according to an aspect of the present disclosure.

FIG. 11 is a plan view of a portion related to the electrostatic protection circuit EPC of the inactive area NAA of the display panel DP shown in FIG. 3.

Referring to FIGS. 5 and 11, a first electrode D1 of the first transistor T1 in the electrostatic protection circuit EPC is connected to the first data line DL1 through a contact CT1. A second electrode S1 of the first transistor T1 is connected to the second data line DL2 through a contact CT2. A gate electrode G1 of the first transistor T1 may be connected to the first capacitor C1 and the first resistor R1 through a connection electrode CNE11. A lower gate electrode BG1 of the first transistor T1 may be connected to the second capacitor C2 and the second resistor R2 through a connection electrode CNE13.

A first electrode D2 of the second transistor T2 is connected to the second data line DL2 through a contact CT4. A second electrode S2 of the second transistor T2 is connected to the first data line DL1 through a contact CT3. A gate electrode G2 of the second transistor T2 may be connected to the third capacitor C3 and the third resistor R3 through a connection electrode CNE12. A lower gate electrode BG2 of the second transistor T2 may be connected to the fourth capacitor C4 and the fourth resistor R4 through a connection electrode CNE14.

In an embodiment, the first transistor T1 and the second transistor T2 in the electrostatic protection circuit EPC may be formed through the same process as the first to third transistors TR1 to TR3 in the display panel DP illustrated in FIG. 3.

For example, the lower gate electrodes BG1 and BG2 of the first and second transistors T1 and T2 may be formed on the same layer as the lower gate electrode BGE1 of the first transistor TR1 shown in FIG. 5. The first and second electrodes D1 and S1 of the first transistor T1 and the first and second electrodes D2 and S2 of the second transistor T2 may be formed on the same layer as the first and second electrodes DE1 and SE1 of the first transistor TR1 shown in FIG. 5. The gate electrode G1 of the first transistor T1 and the gate electrode G2 of the second transistor T2 may be formed on the same layer as the gate electrode GE1 of the first transistor TR1 shown in FIG. 5.

The first capacitor C1 includes a first electrode C1a and a second electrode C1b. The second capacitor C2 includes a first electrode C2a and a second electrode C2b. The third capacitor C3 includes a first electrode C3a and a second electrode C3b. The fourth capacitor C4 includes a first electrode C4a and a second electrode C4b.

The first electrodes C1a, C2a, C3a, and C4a respectively corresponding to the first to fourth capacitors C1 to C4 may be formed on the same layer as the lower gate electrode BG1 of the first transistor T1 and the lower gate electrode BG2 of the second transistor T2.

The second electrodes C1b, C2b, C3b, and C4b respectively corresponding to the first to fourth capacitors C1 to C4 may be formed on the same semiconductor layer (i.e., the first and second electrodes D1 and S1) of the first transistor T1 and the same semiconductor layer (i.e., the first and second electrodes D2 and S2) of the second transistor T2.

Each of the first to fourth resistors R1, R2, R3, and R4 may be formed of the same semiconductor layer as that of each of the first and second transistors T1 and T2.

The first electrode C1a of the first capacitor C1 is connected to the second data line DL2 through a contact CT5. The first electrode C2a of the second capacitor C2 is connected to the second data line DL2 through a contact CT6. The first electrode C3a of the third capacitor C3 is connected to the first data line DL1 through a contact CT7. The first electrode C4a of the fourth capacitor C4 is connected to the first data line DL1 through a contact CT8.

The second and fourth resistors R2 and R4 may be connected to the reference voltage line VL_R through the connection electrode CNE14.

Although an embodiment of the present disclosure has been described for illustrative purposes, those skilled in the art will appreciate that various modifications, and substitutions are possible, without departing from the scope and spirit of the present disclosure as disclosed in the accompanying claims.

Accordingly, the technical scope of the present disclosure is not limited to the detailed description of this specification, but should be defined by the claims.

A display panel having such a configuration includes an electrostatic protection circuit connected between signal lines. The static electricity protection circuit may protect the display panel when static electricity is applied to the signal lines.

While the present disclosure has been described with reference to embodiments thereof, it will be apparent to those of ordinary skill in the art that various changes and modifications may be made thereto without departing from the spirit and scope of the present disclosure as set forth in the following claims.

What is claimed is:

1. A display panel comprising:
a first data signal line;
a second data signal line; and
an electrostatic protection circuit comprising a first protection circuit electrically connected between the first data signal line and the second data signal line,
wherein the first protection circuit comprises:
a first dual-gate transistor connected between the first data signal line and the second data signal line, and comprising a gate electrode and a lower gate electrode;
a first resistor connected between the gate electrode of the first dual-gate transistor and the second data signal line;
a first capacitor connected between the gate electrode of the first dual-gate transistor and the second data signal line; and
a second capacitor connected between the lower gate electrode of the first dual-gate transistor and the second data signal line,
wherein the lower gate electrode of the first dual-gate transistor receives a reference voltage.

2. The display panel of claim 1, wherein the first protection circuit further comprising:
a second resistor connected between the lower gate electrode of the first dual-gate transistor and a reference voltage line receiving the reference voltage.

3. The display panel of claim 1, wherein, in a normal operation state, the first dual-gate transistor is maintained in a turn-off state by the reference voltage.

4. The display panel of claim 1, wherein the first dual-gate transistor is an N-type transistor.

5. The display panel of claim 4, wherein a threshold voltage of the first dual-gate transistor has a voltage level higher than a maximum voltage difference between a first signal delivered through the first data signal line and a second signal delivered through the second data signal line.

6. The display panel of claim 1, wherein the electrostatic protection circuit further comprises a second protection circuit electrically connected between the first data signal line and the second data signal line,
wherein the second protection circuit comprises:
a second dual-gate transistor connected between the first data signal line and the second data signal line, and comprising a gate electrode and a lower gate electrode;
a third resistor connected between the gate electrode of the second dual-gate transistor and the first data signal line;
a third capacitor connected between the gate electrode of the second dual-gate transistor and the first data signal line; and
a fourth capacitor connected between the lower gate electrode of the second dual-gate transistor and the first data signal line,
wherein the lower gate electrode of the second dual-gate transistor receives the reference voltage.

7. The display panel of claim 6, wherein the second protection circuit further comprising:
a fourth resistor connected between the lower gate electrode of the second dual-gate transistor and a reference voltage line receiving the reference voltage.

8. The display panel of claim 6, wherein the second dual-gate transistor is an N-type transistor.

9. The display panel of claim 8, wherein a threshold voltage of the second dual-gate transistor has a voltage level higher than a maximum voltage difference between a first signal delivered through the first data signal line and a second signal delivered through the second data signal line.

10. The display panel of claim 1, further comprising:
a plurality of pixels, each of which is connected to a corresponding signal line among the first data signal line and the second data signal line.

11. A display panel comprising:
a first data signal line;
a second data signal line;
a first protection circuit connected between the first data signal line and a first node; and
a second protection circuit electrically connected between the first node and the second data signal line,
wherein the first protection circuit comprises:
a first dual-gate transistor connected between the first data signal line and the first nod; and comprising a gate electrode and a lower gate electrode;
a first resistor connected between the gate electrode of the first dual-gate transistor and the first node;
a first capacitor connected between the gate electrode of the first dual-gate transistor and the first node; and
a second capacitor connected between the lower gate electrode of the first dual-gate transistor and the first node,
wherein the lower gate electrode of the first dual-gate transistor receives a reference voltage.

12. The display panel of claim 11, further comprising:
a third protection circuit connected between the first data signal line and a second node; and
a fourth protection circuit connected between the second node and the second data signal line.

13. A display device comprising:
a driving circuit which provides a driving signal; and
a display panel electrically connected to the driving circuit through pads,
wherein the display panel comprising:
a first data line connected to a first pad among the pads;
a second data line connected to a second pad among the pads; and
an electrostatic protection circuit comprising a first protection circuit electrically connected between the first data line and the second data line,
wherein the first protection circuit comprises:
a first dual-gate transistor connected between the first data line and the second data line and comprising a gate electrode and a lower gate electrode;
a first resistor connected between the gate electrode of the first dual-gate transistor and the second data line;
a first capacitor connected between the gate electrode of the first dual-gate transistor and the second data line; and
a second capacitor connected between the lower gate electrode of the first dual-gate transistor and the second data line, and
wherein the lower gate electrode of the first dual-gate transistor receives a reference voltage.

14. The display device of claim 13, wherein the display panel comprises a pixel, and
wherein the pixel comprises:
a light emitting element;
a first pixel transistor electrically connected to the light emitting element; and
a second pixel transistor electrically connected between the first data line and the first pixel transistor.

15. The display device of claim 14, wherein each of the first dual-gate transistor and at least one of the first pixel transistor and the second pixel transistor is an N-type transistor.

16. The display device of claim 15, wherein a threshold voltage of the first dual-gate transistor has a voltage level higher than a maximum voltage difference between a first signal delivered through the first data line and a second signal delivered through the second data line.

17. The display device of claim 13, wherein the first protection circuit further comprising:
a second resistor connected between the lower gate electrode of the first dual-gate transistor and a reference voltage line receiving the reference voltage.

18. The display device of claim 13, wherein, in a normal operation state, the first dual-gate transistor is maintained in a turn-off state by the reference voltage.

19. The display device of claim 13, wherein the electrostatic protection circuit further comprises a second protection circuit electrically connected between the first data line and the second data line, and
wherein the second protection circuit comprises:
a second dual-gate transistor connected between the first data line and the second data line; and comprising a gate electrode and a lower gate electrode;
a third resistor connected between the gate electrode of the second dual-gate transistor and the first data line;
a third capacitor connected between the gate electrode of the second dual-gate transistor and the first data line; and
a fourth capacitor connected between the lower gate electrode of the second dual-gate transistor and the first data line,
wherein the lower gate electrode of the second dual-gate transistor receives the reference voltage.

20. The display device of claim 19, wherein the second protection circuit further comprising:
a fourth resistor connected between the lower gate electrode of the second dual-gate transistor and a reference voltage line receiving the reference voltage.

* * * * *